United States Patent [19]
Sorrentino

[11] Patent Number: 6,043,991
[45] Date of Patent: Mar. 28, 2000

[54] CARD PANEL HAVING A BRACKET WITH INTEGRALLY FORMED TRACK FOR AN EMI REDUCTION SPRING

[75] Inventor: Gregory L. Sorrentino, Brewster, N.Y.

[73] Assignee: General DataComm, Inc., Middlebury, Conn.

[21] Appl. No.: 09/099,790

[22] Filed: Jun. 18, 1998

[51] Int. Cl.$^7$ ..................................................... H05K 9/00
[52] U.S. Cl. ......................... 361/816; 361/752; 361/800; 361/818; 361/825; 174/35 R; 174/35 GC
[58] Field of Search ..................................... 361/748, 752, 361/753, 796, 797, 800, 802, 816, 818, 825; 174/35 R, 35 GC; 211/41.17; 206/706, 709, 719

[56] References Cited

U.S. PATENT DOCUMENTS

| | | | |
|---|---|---|---|
| 3,504,095 | 3/1970 | Roberson et al. | 174/35 GC |
| 4,872,212 | 10/1989 | Roos et al. | 361/818 |
| 5,293,303 | 3/1994 | Fletcher et al. | 361/798 |
| 5,546,282 | 8/1996 | Hill et al. | 361/796 |

OTHER PUBLICATIONS

Brochure from Tech–Etch on RFI/EMI Product Information, Plymouth, MA. pp. 5–9. (No Date Provided).

*Primary Examiner*—Leo P. Picard
*Assistant Examiner*—Jayprakash N. Gandhi
*Attorney, Agent, or Firm*—David P. Gordon; David S. Jacobson; Thomas A. Gallagher

[57] ABSTRACT

A card panel includes a conductive bracket and a circuit board coupled to the bracket. The bracket includes a front side, and first and second lateral sides. The board is coupled to an inner surface of the first side of the bracket, while an outer surface of the first side operates as a conductive contact. The outer surface of the second side of the bracket includes an integrally molded T-shaped track, and a hole at each end of the track. An elongate conductive spring having a generally triangular cross-section with two inwardly directed lower flanges and a raised portion is positioned on the track such that each of the lower flanges is held by track and further such that the ends of the spring are positioned between the holes in the track. Rivets are provided in the holes and maintaining the spring on the track. The integrally molded track permits easy installation of the spring to the bracket. The integration of the components provides an assembly having relatively few components and a relatively low cost. Moreover, the molded track is relatively straight, stiff, and more resistant to damage than prior art spring assemblies. As such, the spring has a more uniform compression and is held flat and straight against the bracket. Electromagnetic interference is thereby reduced. Furthermore, should the spring become damaged, the rivets securing the spring may be easily removed to facilitate replacement of the spring.

20 Claims, 4 Drawing Sheets

CARD PANEL HAVING A BRACKET WITH INTEGRALLY FORMED TRACK FOR AN EMI REDUCTION SPRING

BACKGROUND OF THE INVENTION

1. Field of the Invention

This invention relates broadly to card panels which are coupled to a backplane, e.g., in a telecommunications network. More particularly, this invention relates to electromagnetic interference reduction elements for the card panels.

2. State of the Art

Card panels, each of which provides particular functionality, are 'plugged' into backplanes or racks. Such card panels are commonly used in telecommunications networks. However, when a plurality of circuit cards and/or panels are provided in a rack, the circuit cards produce electromagnetic radiation in the form of electric and magnetic waves that may adversely interfere with other cards inside the rack and electronic equipment outside of the rack. The spaces or gaps between adjacent card panels provide a path through which electromagnetic radiation may escape, unless the spaces or gaps are provided with a conductive barrier to prevent the electromagnetic interference (EMI).

Referring to prior art FIGS. 1 through 3, a card panel 10 includes a generally C-shaped, conductive bracket 12 and a circuit board 14 coupled to the bracket. The bracket 12 includes a front side 16 and first and second lateral sides 18, 20. The board 14 includes circuitry, e.g., integrated circuit packages 22, other circuitry 24, ports 26, connectors 28 for coupling the board 14 to a backplane, and indicator LEDs 30. The board 14 is coupled to the inner surface 32 of the first side 18 of the bracket 12, while the outer surface 34 of the first side is substantially planar. The front side 16 is typically provided with cut-outs which receive therethrough the ports 26 on the board 14 to permit user-assigned connectivity to other components, and may also permit the LED indicators 30 on the board 14 to be seen therethrough. A cosmetic face plate 36 is provided over the front side 16, and includes printed indicia 38 thereon to provide identifying information to a user. The outer surface 40 of the second side 20 of the bracket 12 is provided with an elongate copper spring 42 which performs as a conductive barrier. As shown in FIG. 2, the spring 42 has a generally triangular cross-section with two lower flanges 43, 44, and raised portion 45 provided with a plurality of gaps 46 which form a plurality of independently compressible spring portions 48.

When the card panel is placed in a rack, the spring 42 contacts the first side 18 of another card panel already positioned in the rack. The independently compressible spring portions 48 of the spring 42 act to form an electrical bond between the panel to which the spring is attached and the first side of another card panel or conductor of the rack. In this manner, the spring 42 functions to conductively contact a conductive portion of an adjacent card or a conductor on the rack and thereby ground the card panel 10 to reduce EMI.

In the prior art, several different assemblies are provided for coupling the EMI reduction spring 42 to the card panel 10. According to one assembly, as shown in FIG. 2, the spring 42 includes an inwardly bent flange 44 which is coupled to the outer surface 40 of the second side 20 with an adhesive 50. The adhesive 50 must be positioned on the outer surface 40 adjacent a free end 52 of the second side 20 (away from front side), such that when the card panel 10 is inserted into a rack, the spring is not inadvertently caught and removed. Turning now to FIG. 4, in another prior art spring assembly, the spring 42a includes an inwardly bent flange 43a, and an outwardly bent flange 44a. The outwardly bent flange 44a is coupled by an adhesive 50a to the outer surface 40a of the second side 20a of a bracket 12a of a card panel.

However, both of these prior art assemblies have several disadvantages. First, the springs 42, 42a may tear off, especially upon removal of the card panel from the rack. Second, it is easy to assemble the spring incorrectly, i.e., with the adhesive away from the free end 52. Such assembly may cause the spring 42, 42a to be undesirably deformed, i.e., with the flange 43, 43a being bent away from the second side 20, 20a upon insertion of the card panel into a rack. Such undesirable deformation makes the spring unusable and compromises the integrity of the EMI-reduction barrier. Third, the adhesive may dry up or delaminate under certain conditions, such as relatively hot or cold temperatures, over a period of time.

Referring now to FIG. 5, in yet another prior art spring assembly which does not necessitate the use of an adhesive, a track 54b is coupled to the outer surface 40b of the second side 20b of a bracket 12b. The track 54b is secured to the second side 20b with a plurality of screws or rivets 56b. The spring 42b is then slidably disposed over the track. This assembly also has several problems. First, a large number of rivets 56b are required to hold the track 54b against the second side 20b. Therefore, a time consuming process for assembly of the track to the bracket is required. In addition, the rivets 56b may interfere with ports and circuitry on a circuit board coupled to the bracket 12b. Second, the assembly, requiring a discrete track member 54b and a large number of rivets 56b for coupling the track member to the bracket, is relatively expensive to manufacture. Third, the track does not always lie flat and straight, and may bend, twist, or bow relative to the bracket 12b. Such irregularities may cause the spring to be inadvertently removed by an adjacent card panel and will create discontinuities in the EMI barrier.

SUMMARY OF THE INVENTION

It is therefore an object of the invention to provide a spring assembly for a bracket of a card panel which minimizes EMI barrier discontinuity.

It is another object of the invention to provide spring assembly for a bracket of a card panel which provides for uniform compression of the spring.

It is a further object of the invention to provide a spring assembly for a bracket of a card panel which has improved structural integrity.

It is an additional object of the invention to provide a spring assembly for a bracket of a card panel which is relatively inexpensive to manufacture.

It is also an object of the invention to provide a spring assembly for a bracket of a card panel which utilizes relatively few parts.

It is a further object of the invention to provide a spring assembly for a bracket of a card panel which permits the spring to be easily installed and replaced.

In accord with these objects, which will be discussed in detail below, a card panel includes a generally C-shaped, conductive bracket and a circuit board coupled to the bracket. The bracket includes a front side, and first and second lateral sides. The board is coupled to the first side of the bracket. The second side of the bracket includes an integrally molded track, preferably T-shaped, provided with a hole in each end of the track for receiving a single rivet therethrough. An elongate conductive spring having a generally triangular cross-section with two inwardly-directed lower flanges and a raised portion is positioned on the track such that each of the lower flanges is held by the track. The spring is provided with a plurality of gaps which effectively form a plurality of independently compressible spring portions. The ends of the spring are positioned between the holes in the track, and a rivet is placed in each hole and prevents the spring from sliding off of the track.

It will be appreciated that the integrally extruded track permits easy installation of the spring to the bracket. The integration of the components provides an assembly with fewer components and lower costs. Moreover, the extruded track is relatively straight, stiff, and more resistant to damage than prior art spring assemblies. As such, the spring has more uniform compression and is held flat and straight against the panel, guaranteeing maximum surface contact and electrical continuity to the metal panel. Electromagnetic energy is thereby contained by this barrier between each panel. Furthermore, should the spring become damaged, the rivets securing the spring may easily be removed to facilitate replacement of the spring.

Additional objects and advantages of the invention will become apparent to those skilled in the art upon reference to the detailed description taken in conjunction with the provided figures.

BRIEF DESCRIPTION OF THE DRAWINGS

Prior art

Prior art

Prior art

Prior art

Prior art

DETAILED DESCRIPTION OF THE PREFERRED EMBODIMENTS

Figure 1:
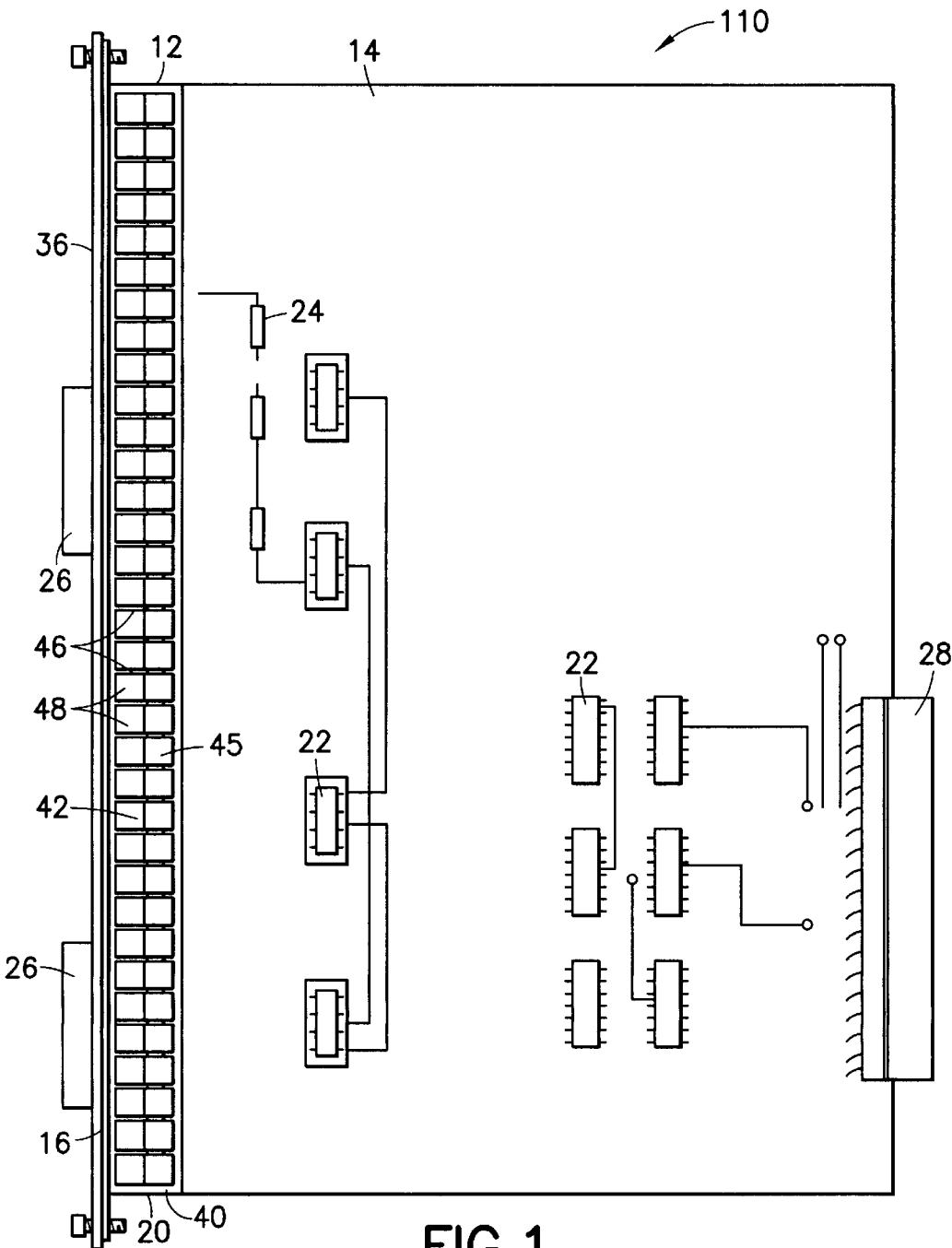
FIG. 1 is a side elevation of a first prior art card panel.
Figure 2:
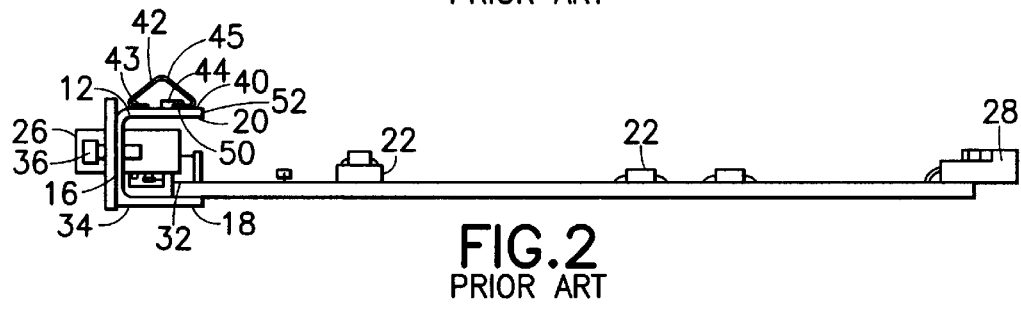
FIG. 2 is a end view of the first prior art card panel.
Figure 3:
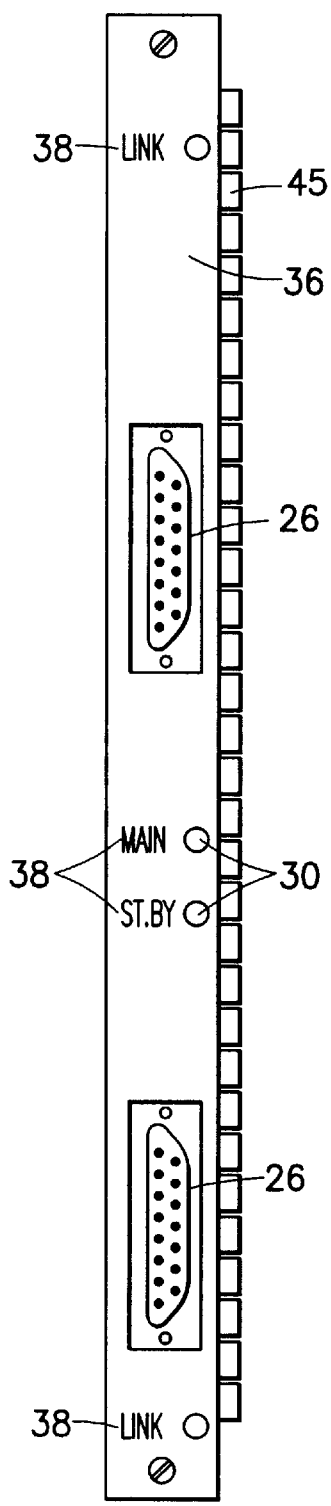
FIG. 3 is a front view of the first prior art card panel.
Figure 4:
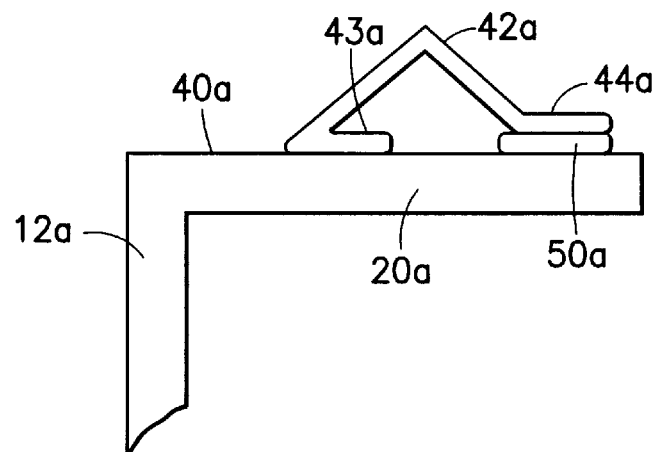
FIG. 4 is a partial section end view of bracket and spring assembly portions of a second prior art card panel.
Figure 5:
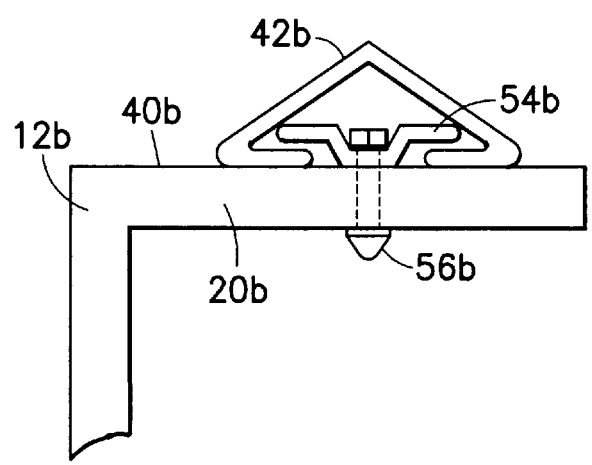
FIG. 5 is a partial section end view of bracket and spring assembly portions of a third prior art card panel.
Figure 6:
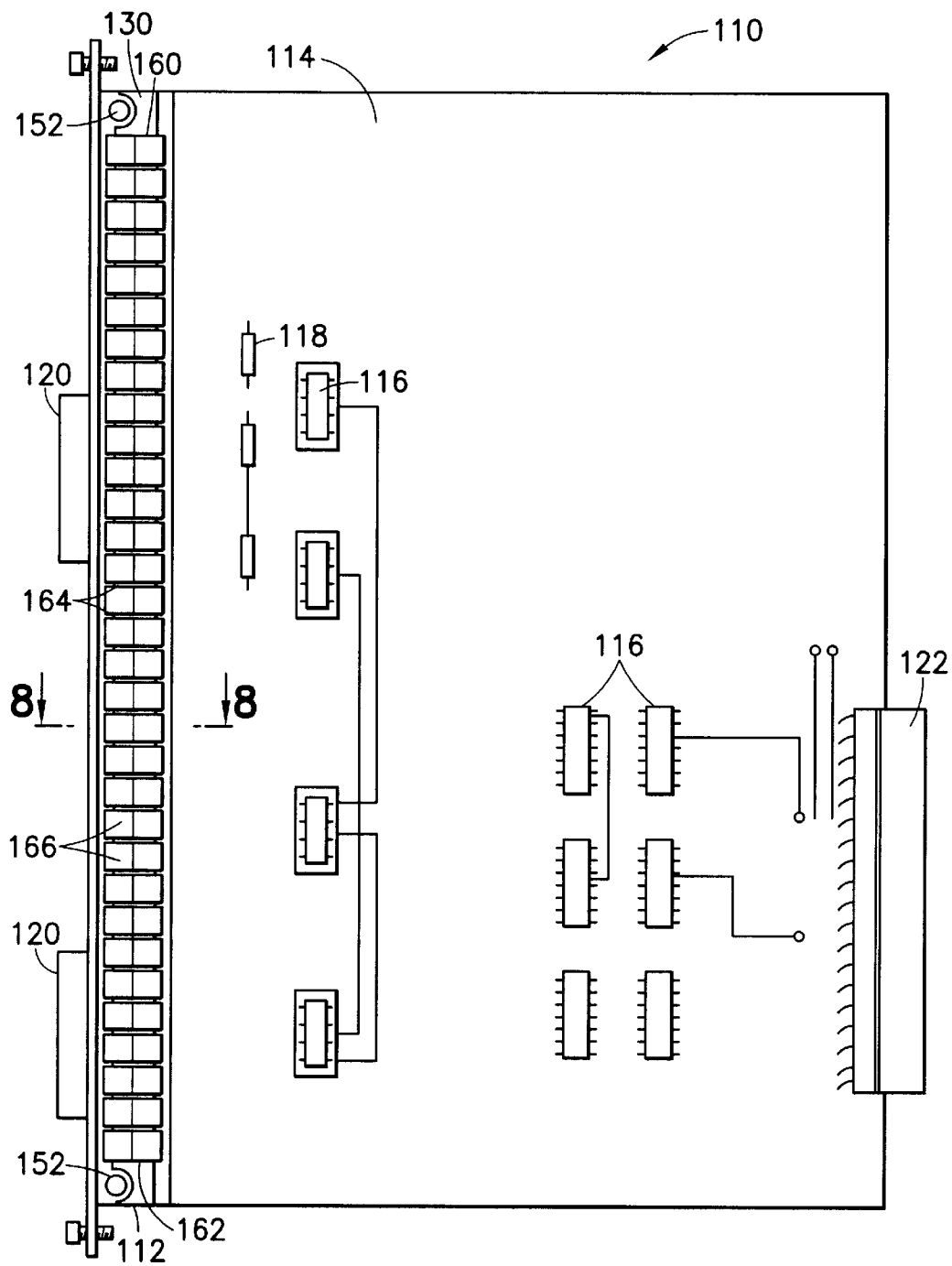
FIG. 6 is a side elevation of a card panel using a bracket and spring assembly according to the invention.
Figure 7:
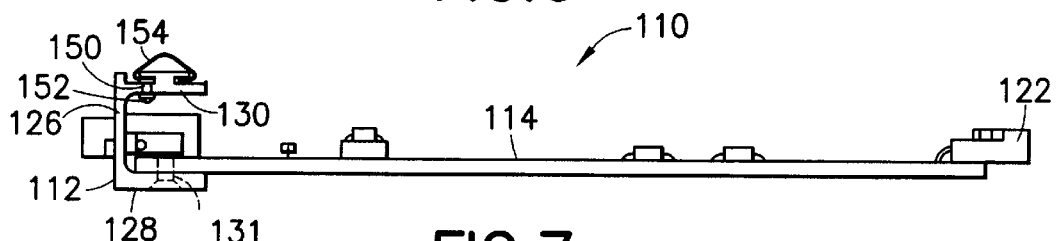
FIG. 7 is an end view of the card panel shown in FIG. 6.

Turning now to FIGS. 6 and 7, a card panel 110 is shown with a bracket 112 according to the invention, and a circuit board 114 coupled to the bracket 112. The circuit board 114 includes circuitry, e.g., integrated circuit packages 116, other circuitry 118, ports 120, connectors 122 for coupling the board 114 to a backplane, and indicator LEDs (not shown). The bracket 112 is preferably extruded into a generally C-shaped configuration, and is comprised of a conductive material, e.g., aluminum. The bracket 112 includes a front side 126, and first and second lateral sides 128, 130, respectively. The circuit board 114 is coupled, preferably by screws 131, adjacent an inner surface 132 of the first side 128 of the bracket 112. An outer surface 134 of the first side 128 functions as a substantially planar, conductive contact.

Figure 8:
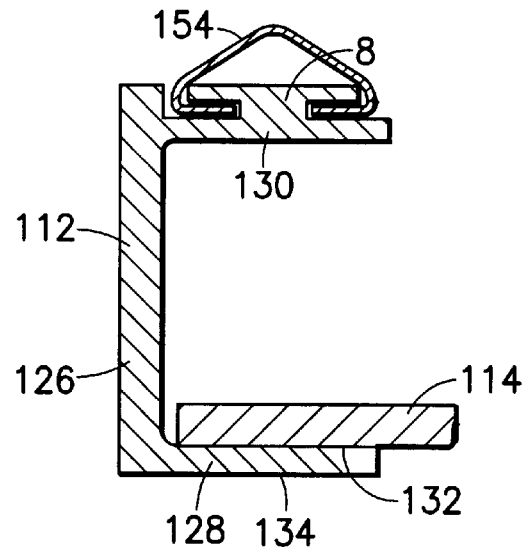
FIG. 8 is a cross-section through line 8—8 of FIG. 6.
Figure 9:
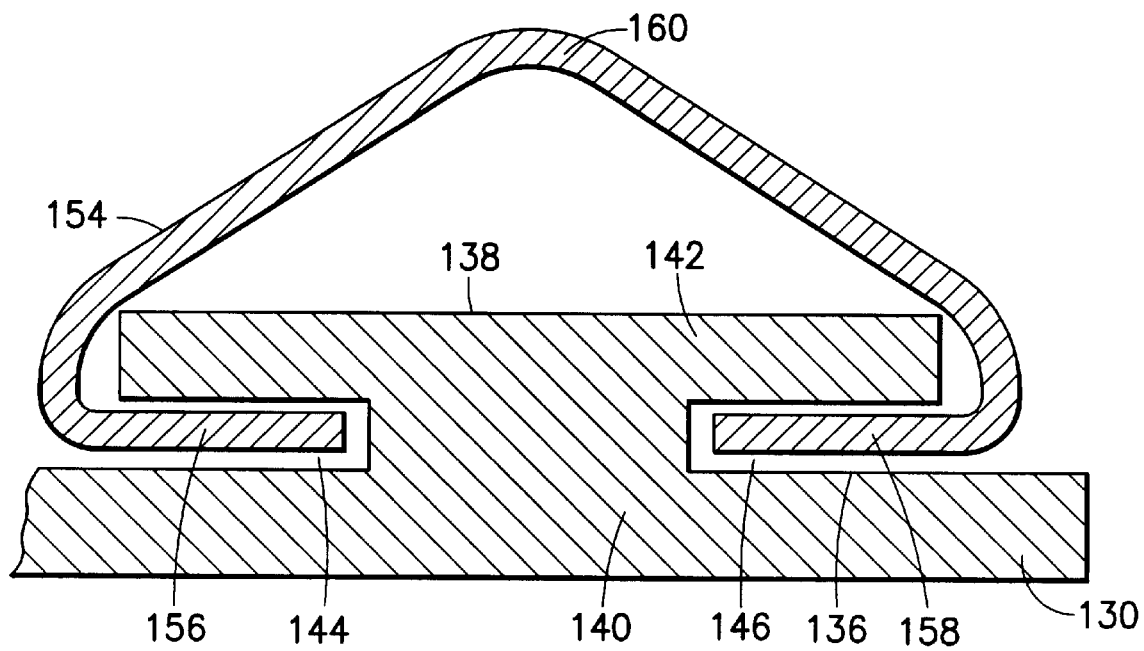
FIG. 9 is an enlarged partial section of the bracket shown in FIG. 8.

Referring to FIGS. 8 and 9, the outer surface 136 of the second side 130 of the bracket 112 includes an integrally extruded linear track 138, preferably T-shaped, with a stem portion 140, an upper portion 142 substantially perpendicular to the stem portion 140, and slots 144, 146 formed between the upper portion 142 and the outer surface 136 of the second side 130. The stem portion 140, between the upper portion 142 and the outer surface 136, preferably has a height of approximately 0.020–0.025 inches. The upper portion 142 has a thickness of approximately 0.020–0.040 inches, and a width of approximately 0.25 inches. The second side 130 is provided with a hole 150 which intersects a slot 144 at each end of the track 138 for receiving a preferably resilient, barbed rivet 152 therethrough (FIGS. 6 and 7).

Referring back to FIGS. 6 and 7, an elongate conductive spring 154, preferably made from copper, has a generally triangular cross-section with two inwardly directed lower flanges 156, 158 and a raised portion 160. The spring 154 is positioned on the track 138 such that each of the lower flanges 156, 158 is provided in one of the slots 144, 146. The ends 160, 162 of the spring 154 reside between the holes 150 in the track. The rivets 152, placed in the track 138 after the spring 154 has been disposed on the track, prevent the spring from sliding off of the track of the bracket 112. If the spring becomes damaged, one of the resilient rivets may easily be removed (e.g., with a pliers), the damaged spring may be slidably removed from the track, and a new spring may be quickly placed on the track and secured thereon with another rivet. The spring 154 is provided with a plurality of gaps 164 which effectively form a plurality of independently compressible spring portions 166.

When the card panel 110 is placed in a rack, the spring 154 either compressibly contacts a conductor on the rack (when the card is the first placed in a rack), or compressibly contacts the first side 128 of another card panel already positioned in the rack. The compressed spring 154, in contact with the rack or another card, functions to reduce electromagnetic radiation from escaping between card panels 110. Due to the integral construction of the track 138 with the bracket 112, the track and the spring on the track have an optimized alignment permitting more uniform compression of the spring against an adjacent first side of a card panel or the rack. The uniformity of compression decreases discontinuity between the spring and adjacent contacts to thereby minimize EMI leakage.

Moreover, the spring may be assembled to the bracket quickly and easily, and such assembly requires relatively few components: the bracket, the spring, and two rivets. The assembly is of a relatively low cost manufacture. In addition, the assembly maintains its integrity in all temperature conditions to which the card panel may be subject. Furthermore, because both flanges of the spring are provided in a slot of the track, the spring is less susceptible to being caught on an adjacent card and damaged. However, as discussed above, should the spring be damaged, the assembly permits relatively quick and easy repair.

There have been described and illustrated herein a card panel having a bracket with an integral track for an EMI reduction spring. While particular embodiments of the invention have been described, it is not intended that the invention be limited thereto, as it is intended that the invention be as broad in scope as the art will allow and that the specification be read likewise. Thus, while particular conductive materials for the bracket and spring have been disclosed, it will be appreciated that other conductive materials can be used as well. Moreover, while a resilient rivet is disclosed to act as a retainer for the spring, other retainers, e.g., screws, plugs, pins, clips, etc., may also be used. Also, while certain dimensions have been disclosed with respect to a preferred panel card, it will be appreciated that other brackets having tracks with other dimensions can also be used. Furthermore, while the EMI-reduction spring assembly has been disclosed for use on card panels operable in telecommunications systems, it will be appreciated that the EMI-reduction spring assembly described herein may be used on other types of card panels in other types of systems. In addition, while the track is preferably extruded with the bracket, it may also be molded to the bracket. It will therefore be appreciated by those skilled in the art that yet other modifications could be made to the provided invention without deviating from its spirit and scope as so claimed.

What is claimed is:

1. A card panel, comprising:
   a) a conductive bracket having an integrally formed substantially linear track provided with first and second receiving slots;
   b) an elongate conductive spring disposed on said track, said spring having first and second flanges which seat in said first and second receiving slots, respectively, and a compressible raised portion; and
   c) a circuit board coupled to said bracket.

2. A card panel according to claim 1, wherein:
   said bracket is substantially C-shaped and includes first and second lateral sides, each having an outer surface, and a central side between said first and second lateral sides,
   said track being provided along said outer surface of said first lateral side.

3. A card panel according to claim 2, wherein:
   said first side of said bracket is provided with two holes which intersect said slots of said track, said spring includes first and second ends situated between said holes, and said card panel further comprising stop means provided in said holes for preventing said spring from being slidably removed from said track.

4. A card panel according to claim 3, wherein:
   said stop means are resilient barbed rivets.

5. A card panel according to claim 2, wherein:
   said track is T-shaped, including a stem portion and an upper portion oriented substantially perpendicularly to said stem portion, said slots being formed between said upper portion and said first side.

6. A card panel according to claim 5, wherein:
   said stem portion has a width of approximately 0.020–0.025 inches, and said upper portion has a width of approximately 0.25 inches and a thickness of approximately 0.020–0.040 inches.

7. A card panel according to claim 1, wherein:
   said bracket is extruded with said track.

8. A card panel according to claim 1, wherein:
   said bracket is made from aluminum.

9. A card panel according to claim 1, wherein:
   said spring includes a plurality of linearly-arranged, individually-compressible portions.

10. A card panel according to claim 2, wherein:
    said outer surface of said second lateral side is substantially planar.

11. An EMI reduction assembly for a card panel, comprising:
    a) a conductive bracket having an integrally formed substantially linear track provided with first and second receiving slots; and
    b) an elongate conductive spring disposed on said track, said spring having first and second flanges which seat in said first and second receiving slots, respectively, and a compressible raised portion.

12. An EMI reduction assembly according to claim 11, wherein:
    said bracket is substantially C-shaped and includes first and second lateral sides, each having an outer surface, and a central side between said first and second lateral sides,
    said track being provided along said outer surface of said first lateral side.

13. An EMI reduction assembly according to claim 12, wherein:
    said track is T-shaped, including a stem portion and an upper portion oriented substantially perpendicularly to said stem portion, said slots being formed between said upper portion and said first side.

14. An EMI reduction assembly according to claim 13, wherein:
    said stem portion has a width of approximately 0.020–0.025 inches, and said upper portion has a width of approximately 0.25 inches and a thickness of approximately 0.020–0.040 inches.

15. An EMI reduction assembly according to claim 13, wherein:
    said bracket is extruded with said track.

16. An EMI reduction assembly according to claim 11, wherein:
    said bracket is made from aluminum.

17. An EMI reduction assembly according to claim 11, wherein:
    said first side of said bracket is provided with two holes which intersect said slots of said track, said spring includes first and second ends situated between said holes, said EMI reduction assembly further comprising stop means provided in said holes for preventing said spring from being slidably removed from said track.

18. An EMI reduction assembly according to claim 17, wherein:
    said stop means are resilient barbed rivets.

19. An EMI reduction assembly according to claim 11, wherein:
    said spring includes a plurality of linearly-arranged, individually-compressible portions.

20. An EMI reduction assembly according to claim 11, wherein:
    said outer surface of said second lateral side is substantially planar.

* * * * *